(12) United States Patent
Inaba

(10) Patent No.: US 8,044,330 B2
(45) Date of Patent: Oct. 25, 2011

(54) ELECTRICALLY CONDUCTIVE ADHESIVE

(75) Inventor: Akira Inaba, Ibaraki-Ken (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 952 days.

(21) Appl. No.: 12/009,305

(22) Filed: Jan. 17, 2008

(65) Prior Publication Data
US 2009/0186219 A1    Jul. 23, 2009

(51) Int. Cl.
*H05B 1/02* (2006.01)
*B23B 7/12* (2006.01)
(52) U.S. Cl. ...... 219/502; 219/505; 219/494; 428/355 R
(58) Field of Classification Search .................. 219/495, 219/504, 505, 502, 494; 524/439; 428/355 R, 428/354
See application file for complete search history.

(56) References Cited

U.S. PATENT DOCUMENTS

| | | | |
|---|---|---|---|
| 4,820,446 | A | 4/1989 | Prud'Homme |
| 4,822,523 | A | 4/1989 | Prud'Homme |
| 5,432,303 | A | 7/1995 | Turek et al. |
| 2001/0015424 | A1 | 8/2001 | Takezawa et al. |
| 2005/0239940 | A1 | 10/2005 | Shima et al. |
| 2005/0288427 | A1 | 12/2005 | Jeon et al. |
| 2006/0210811 | A1 | 9/2006 | Nemeth et al. |

OTHER PUBLICATIONS

International Search Report Dated Nov. 26, 2009 for International Application No. PCT/US2009/031367.

*Primary Examiner* — Mark Paschall

(57) ABSTRACT

Disclosed is an electrically conductive adhesive that includes an electrically conductive powder, a heat-curable silicone resin, and a solvent.

18 Claims, 2 Drawing Sheets

ELECTRICALLY CONDUCTIVE ADHESIVE

BACKGROUND OF THE INVENTION

1. Field of the Invention

The present invention relates to an electrically conductive adhesive in an electric circuit board. The adhesive, which is basically made from the heat-curable silicone resin, shows excellent adhesiveness to an inorganic substrate and excellent thermal conductivity. The conductive adhesive is useful as an electronic component.

2. Technical Background

Solder provided with both electrical conductivity and adhesiveness has been conventionally used to adhere electronic components to a substrate or electric circuit when mounting on an electric circuit board. In recent years, however, there has been a tendency to avoid the use of solder containing lead. Also, the detrimental effect of heat possessed by molten solder on electronic components that lack heat resistance may also become a problem. Therefore, electrically conductive adhesives consisting mainly of a resin and a metal powder have come to be used in recent years. The advantages of these electrically conductive adhesives consist of being lead-free, having a lower treatment temperature than solder, and having a low specific gravity that contributes to reduced weight of electronic equipment. Various attempts have been made to improve the adhesiveness of electrically conductive adhesives containing resin as a main ingredient.

US2001-015424 discloses an electrically conductive adhesive that adheres two electrodes. According to this document, adhesive strength of the electrically conductive adhesive is improved by being composed of a resin having a functional group that forms a coordinate bond with the metal of the electrodes. This solves the problem of separation of the electrodes and the electrically conductive adhesive that frequently occurs in electronic components having large surface areas that are susceptible to bending stress.

US2005-288427 describes an anisotropic electrically conductive adhesive composed of an insulating resin containing a crosslinkable rubber-like resin and electrically conductive particles. According to US2005-288427, separation of the electrically conductive adhesive is prevented, where the rubber-like resin minimizes thermal shrinkage of the anisotropic electrically conductive adhesive that occurs during a polymerization or curing reaction during heating and adhesion. In addition, a silane coupling agent is added to improve the adhesion environment of adhesive surfaces.

However, electrically conductive adhesives composed of conventional thermoplastic organic binder resins still lack adhesiveness to many inorganic substrates or electrodes. In addition, since electric components or electric devices mounted on a substrate with an electrically conductive adhesive have low heat resistance, there is the problem of deterioration of these components or devices in the process during which the adhesive is heat-cured. In addition, where there is increasing amounts of heat generated from electronic components in the manner of IC chips and LED chips, accompanying the higher levels of performance and reduced size of electronic components, it is difficult to dissipate this heat. Moreover, in the case where the electronic device is a light source, organic adhesives may be deteriorated by ultraviolet light.

The present invention addresses the problems of improving adhesive strength and heat releasability during mounting of components with an electrically conductive adhesive.

SUMMARY OF THE INVENTION

The present invention provides an electrically conductive adhesive that improves adhesive strength, heat releasability and resistance to ultraviolet light while also being able to be cured at low temperatures.

The electrically conductive adhesive of the present invention comprises an electrically conductive powder, a heat-curable silicone resin, and a solvent. In the present invention, a heat-curable silicone resin is preferably used that contains an alkyl functional group having 1 to 10 carbon atoms or a phenyl group, and has a polysiloxane oligomer for the backbone thereof. Since heat-curable silicone resins can be cured at lower temperatures than organic resins, they are effective as adhesives for electric devices or electronic components having low resistance to high temperatures. In addition, although another organic substance is naturally preferable for adhesion to an inorganic electrode, adhesive strength after curing is increased by using a paste containing a resin that changes to an inorganic substance due to heating and degradation such as a heat-curable silicone resin having a functional group. Moreover, since inorganic substances have higher thermal conductivity than organic substances, inorganic substances contribute to dissipation of heat generated from electronic components.

With respect to heat releasability, an inorganic substance having thermal conductivity of 20 W/km or more is preferably contained to further improve thermal conductivity of the electrically conductive adhesive according to the present invention.

In addition, the present invention provides an electric circuit board formed using the above-mentioned electrically conductive adhesive.

DETAILED DESCRIPTION OF THE INVENTION

Figure 1:
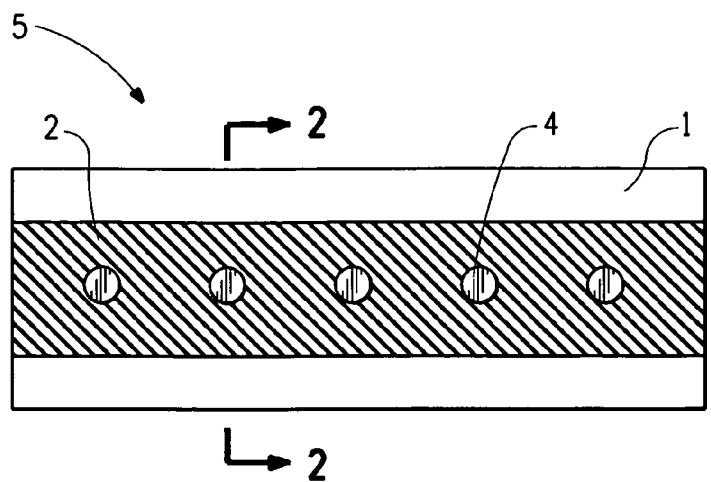
FIG. 1 is an overhead view of an electric circuit board 5 on which an object to be adhered has been placed.
Figure 2:
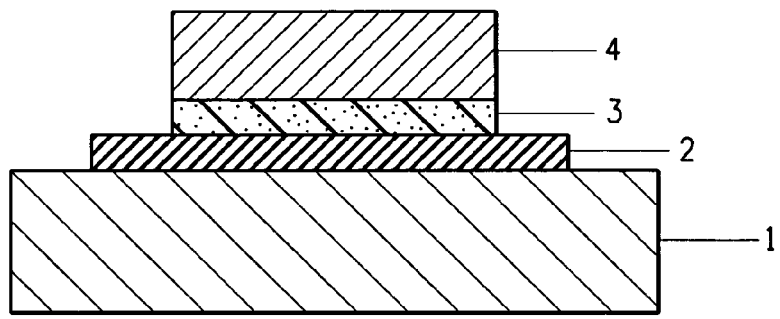
FIG. 2 is a cross-sectional view taken along line II-II of the electric circuit board of FIG. 1.
Figure 3:
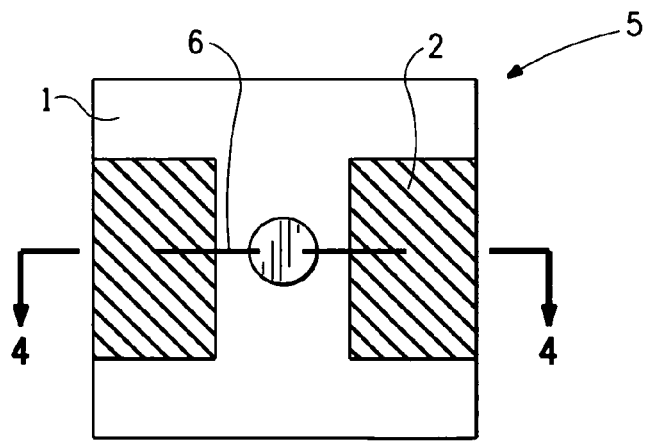
FIG. 3 is an overhead view of an electric circuit board 5 in which an object to be adhered is placed between electric circuits and connected by electrodes and gold wires in a substrate on which electrical circuits have been intermittently formed.
Figure 4:
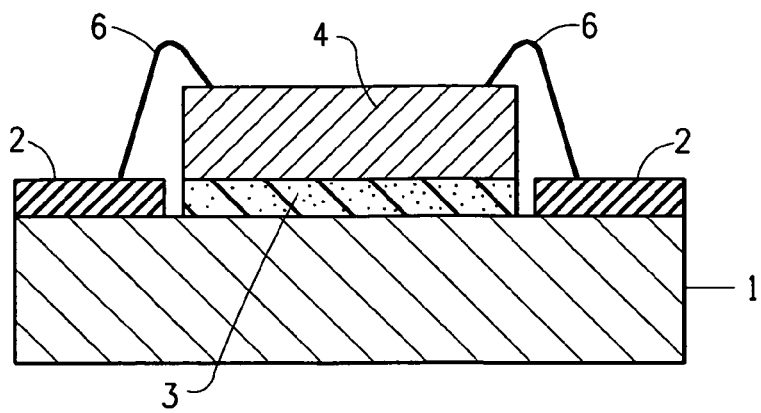
FIG. 4 is a cross-sectional view taken along line IV-IV of the electric circuit board of FIG. 3.

The following provides an explanation of selected embodiments of the present invention using the drawings. In FIG. 1, an electric circuit board is fabricated by coating an electrically conductive adhesive 3 onto an electric circuit 2 on a substrate 1 followed by placing objects to be adhered (adhered objects) 4 thereon and heating in an oven. In addition, as shown in FIG. 3, the adhered objects are adhered to the substrate 1 by an adhesive according to the present invention, and continuity may be maintained with an electric circuit with an electrically conductive connecting material such as gold wire or solder. In this case, the electrically conductive adhesive 3 is applied onto the electric circuits 2 intermittently formed on the substrate 1 and in the spaces there between, the adhered objects 4 are placed thereon, and after connecting the adhered objects 4 and the electric circuits 2 with gold wire 6, an electric circuit board 5 is fabricated by heating.

Figure 5:
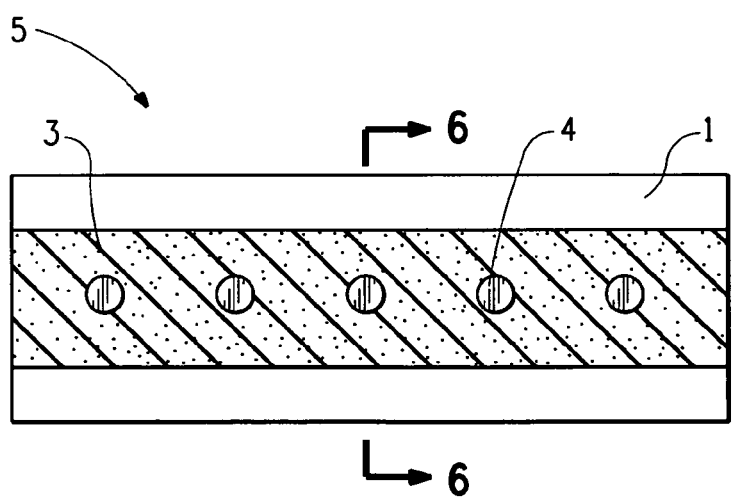
FIG. 5 is an electric circuit board 5 having an electric circuit adhered by an electrically conductive adhesive.
Figure 6:
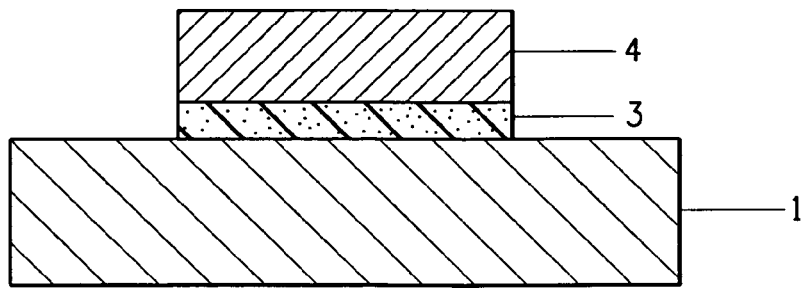
FIG. 6 is a cross-sectional view taken along line VI-VI of the electric circuit board of FIG. 5.

In addition, as shown in FIG. 5, the electrically conductive adhesive of the present invention may also be used as an electric circuit. A process for fabricating an electric circuit board in this case consists of screen printing the electrically conductive adhesive 3 of the present invention directly onto the substrate 1, and then placing an electronic component in the form of an adhered object on the electrically conductive adhesive followed by heating. The following provides an explanation of the composition of the electrically conductive adhesive.

Electrically Conductive Powder

The electrically conductive powder of the present invention is a powder that imparts electrical conductivity to the electrically conductive adhesive. The electrically conductive powder of the present invention is preferably one or more types of metal selected from the group consisting of gold, silver, copper, aluminum, nickel, palladium, platinum, rhodium, stainless steel and alloys thereof. Glass powder plated with the above-mentioned metals on the surface thereof, ceramic powder plated with the above-mentioned metals on the surface thereof and resin powder, plated with the above-mentioned metals on the surface thereof, or graphite may also be used. A single electrically conductive powder may be used, or a plurality of electrically conductive powders may be used. The electrically conductive powder preferably contains one or a plurality of spherical metals, flaked metals, colloidal metals or precious metal resinates.

In the case a plurality of spherical silver powders, flaked silver powders or colloidal silver powders are contained in the electrically conductive powder, the combinations and contents thereof are preferably a) 80% by weight to 99% by weight of spherical silver powder and 1% by weight to 20% by weight of colloidal silver powder, b) 90% by weight to 99% by weight of flaked silver powder and 1% by weight to 10% by weight of colloidal silver powder, or c) 70% by weight to 90% by weight of spherical silver powder and 10% by weight to 30% by weight of flaked silver powder. The use of these combinations makes it possible to achieve both low resistance and high adhesive strength.

The colloidal metal powder of the present invention is nano-sized metal powder having a mean particle diameter of 1 nm to 100 nm. The metal or alloy thereof preferably contains one or a plurality of gold, silver, copper, aluminum, nickel, palladium, platinum, rhodium or stainless steel.

The precious metal contained in the precious metal resinate powder of the present invention is preferably gold (Au), silver (Ag), platinum (Pt) or palladium (Pd). A single precious metal may be contained or a plurality of precious metals may be contained.

The mean particle diameter of the spherical silver powder is preferably 0.1 μm to 10 μm, and more preferably 0.3 μm to 3.0 μm. The mean particle diameter of the flaked silver powder is preferably 0.3 μm to 10.0 μm and more preferably 0.3 μm to 5.0 μm. The mean particle diameter of the colloidal silver powder is preferably 1 nm to 100 nm. The particle diameter of the electrically conductive powder is measured using a particle size distribution meter (MT3300 II, Microtrac Inc.).

The amount of the electrically conductive powder added is preferably 70% by weight to 90% by weight, and more preferably 75% by weight to 85% by weight, based on the total weight of the electrically conductive adhesive prior to heat curing.

Heat-Curable Silicone Resin

The heat-curable silicone resin of the present invention is the polymerized product of a polysiloxane oligomer consisting of silicon and oxygen and a functional group, and is represented by $(R_2SiO)_n$. The R contained in the heat-curable silicone resin is preferably one or two functional groups selected from the group consisting of alkyl groups having 1 to 10 carbon atoms, namely a methyl group, ethyl group, propyl group, butyl group, pentyl group, hexyl group, heptyl group, octyl group, nonyl group or decyl group, or a phenyl group. The R is more preferably one or two functional groups selected from the group consisting of a methyl group, ethyl group and propyl group. A heat-curable silicone resin containing such functional groups undergoes a hydrolysis-polymerization reaction at 150 degrees or higher, and 70% or more thereof changes to inorganic oxide at 300 degrees or lower. Thus, electronic components for which high-temperature treatment is undesirable, such as LED devices, integrated circuits, transistors or packages containing the same can be adhered to a substrate at a low temperature of 300 degrees or lower. Furthermore, the amount of inorganic substance in the silicone resin after curing can be measured using a differential thermal balance (thermogravimetry-differential thermal analysis: TG-DTA). The amount of silicone resin added is preferably 2% by weight to 50% by weight and more preferably 5% by weight to 20% by weight, based on the total weight of the electrically conductive powder.

Solvent

The solvent of the present invention is an organic solvent for adjusting the viscosity of the heat-curable silicone resin. The solvent is preferably an organic solvent having a boiling point of 100 degrees or higher. More preferably, the solvent is selected from the group consisting of hocarpineol, texanol, butylcarbitol, butylcarbitol acetate, dimethylsulfoxide, dioxane, toluene, terpineol, diethylene glycol dimethyl ether, diacetone alcohol, N-methylpyrrolidone, dimethylformamide or dimethylacetoamide. These solvents can be used alone or two or more types can be used after mixing. The amount of solvent added is preferably 4% by weight to 30% by weight of the total weight of the electrically conductive powder.

Inorganic Substance

An inorganic substance may be further added to the electrically conductive adhesive of the present invention to improve thermal conductivity. The inorganic substance added is preferably an inorganic substance having a thermal conductivity of 20 W/km or more, and for example, contains one or a plurality of aluminum oxide ($Al_2O_3$), aluminum nitride (AlN), silicon carbide (SiC), silicon oxide, silicon nitride, silicon oxynitride or diamond powder. The amount of inorganic substance added is preferably 7% by weight to 50% by weight based on the total weight of the electrically conductive powder. An electrically conductive adhesive to which an inorganic substance has been added has further improved thermal conductivity, and when used to adhere an electronic component that generates heat in the manner of an LED device, integrated circuit or transistor, promotes the dissipation of heat generated from the electronic component, thereby reducing the damage incurred by these devices due to heat.

Adhered Object

An adhered object of the present invention is an electronic component to which electricity is supplied. An LED device, LED package, integrated circuit, integrated circuit package, resistor, capacitor and inductor are included in the adhered objects of the present invention.

Substrate

The substrate used in the electric circuit board of the present invention may be an inorganic or organic substrate, examples of which include a paper phenol substrate in which paper has been impregnated with a phenol resin, a paper epoxy substrate in which paper has been impregnated with an epoxy resin, a glass composite substrate in which glass fibers have been layered and impregnated with an epoxy resin, a glass epoxy substrate in which cloths made of glass fibers are layered and impregnated with an epoxy resin, a Teflon® substrate in which Teflon® is used for the insulating material, an aluminum nitride substrate, an alumina substrate, a composite substrate in which paper epoxy substrates have been formed on both sides of a glass epoxy substrate, and stainless steel, aluminum, aluminum alloy or copper metal substrates provided with an insulating layer on the surface thereof.

EXAMPLES

The following provides an explanation of specific examples of the electrically conductive adhesive of the present invention. Electrically conductive adhesives were fabricated having different composite ratios of, electrically conductive powder, heat-curable silicone resin and solvent. The electrically conductive adhesives having different composite ratios are respectively designated as Examples 1 to 20 (see Table 1). The details of each composition are as described below.

Electrically Conductive Powder

Silver powder having a mean particle diameter of 1 μm (#11000-10, Ferro Co., Ltd.)

Silver powder having a mean particle diameter of 0.3 μm (#11000-25, Ferro Co., Ltd.)

Silver powder having a mean particle diameter of 5 μm (SF26, Ferro Co., Ltd.)

Colloidal silver having a mean particle diameter of 10 nm and silver content of 80% (TB-A02, Dowa Electronics Co., Ltd.) Solvent (Texanol, Wako Pure Chemical Industries, Ltd.)

Heat-Curable Silicone Resin

Non-volatile Wacker silicone of the solid methyl type and having a low carbon content (Asahi Kasei Co., Ltd.) was used. This Wacker silicone has the following properties: softening point: 45 to 60 degrees, bulk specific gravity (25 degrees C.): 0.5 to 0.65, curing conditions: 60 minutes at 200 degrees C.

The electrical conductivity and adhesiveness of the electrically conductive adhesive of each of the Examples were evaluated (see Table 1). The production process and evaluation method of the electrically conductive adhesives are as described below.

Electrically Conductive Adhesive Production Process

After weighing the silver of the electrically conductive powder, the heat-curable silicone resin and the solvent at the respective composite ratios indicated in Table 1, the components were adequately stirred with a mixer and dispersed using a 3-roll mill. After adequately dispersing each component, the electrically conductive adhesive was screen-printed onto a glass substrate. The printing patterns consisted of a 10 mm×20 mm rectangular pattern and a 2 mm×60 mm linear pattern. The glass substrates on which the electrically conductive adhesives were printed were dried in an oven under conditions of 150° C. for 20 minutes followed by curing in a firing furnace under conditions of 220° C. for 20 minutes.

Electrically Conductive Adhesive Evaluation Method

The resistance value at the cured film thickness in the form of the 2 mm×60 mm linear pattern on the glass substrate was measured with a multimeter. In addition, the 10 mm×20 mm rectangular pattern on the glass substrate was cross-cut with a knife. Nine square patterns measuring 1 mm×1 mm, 18 rectangular patterns measuring 2 mm×1 mm, and 9 square patterns measuring 2 mm×2 mm were provided on a single glass substrate. Commercially available tape was affixed to the cross-cut portions and after peeling off the tape by hand, the number of patterns of each size that remained on the substrate was counted. The results for adhesive strength indicated in the evaluation columns of Table 1 indicate the quotient obtained by dividing the number of patterns that remained on the substrate by the number of cross-cut patterns. For example, a result of 7/9 means that 7 of 9 cross-cut patterns remained on the substrate following the tape peeling test, while 2 of the patterns were peeled off. A comparison of Examples 1 to 20 revealed that the adhesiveness of the electrically conductive adhesive of Example 1, in which the content of the heat-curable silicone resin is 5% by weight based on the total weight of the electrically conductive powder, is inferior to the electrically conductive adhesiveness of Examples 2 to 20 in which the content of the heat-curable silicone resin exceeds 5% by weight. However, since the resistance of the electrically conductive adhesive of Example 1 is low and more than half of the 2 mm×2 mm patterns remain on the substrate, even the electrically conductive adhesive of Example 1 allows the obtaining of adequate adhesiveness and electrical conductivity when applied over a comparatively large area. The electrically conductive adhesives of Examples 2 to 20, in which the content of the heat-curable silicone resin exceeds 5% by weight, have generally superior adhesiveness with the exception of Example 16. Although all of the electrically conductive adhesives of Examples 1 to 20 have preferable adhesiveness in the case the adhered surface area is comparatively large, in cases in which the adhered surface area is comparatively small, it is preferable to use the electrically conductive adhesives of Examples 2 to 9, 11 to 15 and 17 to 20 since the number of patterns that peeled off was zero even for the 1 mm×1 mm patterns.

With respect to resistance, a trend was observed in which resistance tended to increase the greater the content of the heat-curable silicone resin. In Examples 10 and 11, in which the content of the heat-curable silicone resin exceeds 27% by weight based on the total weight of the electrically conductive powder, resistance values were comparatively high. On the other hand, a comparison of Examples 3 to 12 revealed that resistance values tend to decrease the greater the added amount of colloidal silver provided the amount of heat-curable silicone resin is constant. However, since peeling was not observed for only the 2 mm×2 mm patterns in the case of the electrically conductive adhesive in which the electrically conductive powder consisted entirely of colloidal silver (Example 16), this electrically conductive adhesive is preferable for use in cases in which the adhered surface area is comparatively large.

TABLE 1

| | Paste Composition | | | | | | Evaluation | | | |
|---|---|---|---|---|---|---|---|---|---|---|
| | Conductive Powder | | | | Silicone resin | Solvent | Resistance value | Adhesiveness | | |
| | Spherical D 1 μm | Spherical D 0.3 μm | Flaked D 5 μm | Colloidal 80% Ag | | | | | | |
| | (wt %) | (wt %) | (wt %) | (wt %) | (wt %) | (wt %) | (Ω) | 1 mm × 1 mm | 2 mm × 1 mm | 2 mm × 2 mm |
| Ex. 1 | 100 | — | — | — | 5 | 10 | 1.9 | 0/9 | 5/18 | 5/9 |
| Ex. 2 | 100 | — | — | — | 10 | 10 | 5.2 | 9/9 | 18/18 | 9/9 |
| Ex. 3 | 99 | — | — | 1 | 10 | 10 | 1.1 | 9/9 | 18/18 | 9/9 |
| Ex. 4 | 95 | — | — | 5 | 10 | 10 | 0.6 | 9/9 | 18/18 | 9/9 |
| Ex. 5 | 91 | — | — | 9 | 9 | 9 | 0.8 | 9/9 | 18/18 | 9/9 |
| Ex. 6 | 83 | — | — | 17 | 8 | 8 | 1.3 | 9/9 | 18/18 | 9/9 |
| Ex. 7 | 95 | — | — | 5 | 19 | 10 | 11.4 | 5/9 | 17/18 | 9/9 |
| Ex. 8 | 91 | — | — | 9 | 18 | 9 | 4.0 | 9/9 | 18/18 | 9/9 |
| Ex. 9 | 83 | — | — | 17 | 17 | 8 | 2.2 | 9/9 | 18/18 | 9/9 |
| Ex. 10 | 95 | — | — | 5 | 29 | 10 | 183.0 | 5/9 | 16/18 | 9/9 |
| Ex. 11 | 91 | — | — | 9 | 27 | 9 | 24.3 | 9/9 | 18/18 | 9/9 |
| Ex. 12 | 83 | — | — | 17 | 25 | 8 | 11.0 | 9/9 | 18/18 | 9/9 |
| Ex. 13 | — | 95 | — | 5 | 19 | 10 | 1.7 | 9/9 | 18/18 | 9/9 |
| Ex. 14 | — | — | 100 | — | 20 | 10 | 0.4 | 9/9 | 18/18 | 9/9 |
| Ex. 15 | — | — | 95 | 5 | 19 | 10 | 0.8 | 9/9 | 18/18 | 9/9 |
| Ex. 16 | — | — | — | 100 | 20 | 10 | 3.2 | 0/9 | 0/18 | 9/9 |
| Ex. 17 | 80 | — | 20 | — | 15 | 10 | 1.8 | 9/9 | 18/18 | 9/9 |
| Ex. 18 | — | 80 | 20 | — | 15 | 10 | 1.7 | 9/9 | 18/18 | 9/9 |
| Ex. 19 | 40 | 40 | 20 | — | 15 | 10 | 1.5 | 9/9 | 18/18 | 9/9 |
| Ex. 20 | 85 | 15 | — | — | 11 | 10 | 6.0 | 9/9 | 18/18 | 9/9 |

Moreover, an electrically conductive adhesive having the same composition as Example 20 was evaluated for heat releasability by measuring thermal conductivity (see Table 2). A commercially available electrically conductive adhesive having a typical composition was used for comparison. More specifically, the electrically conductive adhesive used for comparison consisted of 10% by weight of epoxy resin, 85% by weight of silver powder and 5% by weight of solvent.

Thermal conductivity was measured using the following method. An electrically conductive adhesive according to the present invention was screen-printed onto a glass substrate measuring 75 mm×52 mm and having a thickness of 1 mm. The printed pattern measured 18 mm×18 mm and had a thickness of 500 μm. A glass substrate on which the electrically conductive adhesive was printed was dried in an oven under conditions of 150° C. for 20 minutes followed by curing in a firing furnace under conditions of 220° C. for 20 minutes. The glass substrate on which the electrically conductive adhesive had been printed and cured was placed on a hot plate having a surface temperature of 110° C. followed by measurement of the temperature of the cured film surface every 5 seconds.

TABLE 2

| Measuring Time (sec) | Example 20 (° C.) | Comparison (° C.) |
|---|---|---|
| 0 | 28 | 28 |
| 5 | 43 | 43 |
| 10 | 52 | 51 |
| 15 | 59 | 56 |
| 20 | 64 | 58 |
| 25 | 66 | 60 |
| 30 | 69 | 62 |
| 35 | 69 | 64 |
| 40 | 70 | 64 |
| 45 | 71 | 65 |
| 50 | 72 | 65 |
| 55 | 73 | 65 |
| 60 | 73 | 65 |
| 65 | 74 | 65 |
| 70 | 75 | 65 |
| 75 | 75 | 65 |
| 80 | 75 | 65 |
| 85 | 75 | 65 |
| 90 | 75 | 65 |

The electrically conductive adhesive containing heat-curable silicone resin (Example 20) demonstrated a more rapid rise in surface temperature than the electrically conductive adhesive not containing heat-curable silicone resin (Comparison). More specifically, a temperature difference of 3 degrees was already observed after 15 seconds, and a difference of 6 degrees was observed after 20 seconds. In addition, starting at 70 seconds, in contrast to the electrically conductive adhesive according to the present invention being at 75 degrees, the comparison was at 65 degrees. This is because the electrically conductive adhesive of the present invention releases heat by transferring heat of the substrate. Thus, an electrically conductive adhesive containing a silicone resin according to the present invention was determined to have superior thermal conductivity.

What is claimed is:

1. An electrically conductive adhesive comprising: an electrically conductive powder, a heat-curable silicone resin, and a solvent,
    wherein the heat-curable silicone resin comprises an alkyl group having 1 to 10 carbon atoms or a phenyl group, wherein the heat-curable silicone resin undergoes a hydrolysispolymerization reaction at 150 degrees or higher, and wherein the heat-curable silicone resin has a polysiloxane oligomer for backbone of the heat-curable silicone resin.

2. The electrically conductive adhesive according to claim 1, wherein the amount of the heat-curable silicone resin added is 2% by weight to 50% by weight based on the total weight of the electrically conductive powder.

3. The electrically conductive adhesive according to claim 1, wherein the electrically conductive powder is one or more types of metal selected from the group consisting of gold, silver, copper, aluminum, nickel, palladium, platinum, rhodium, stainless steel and alloys thereof, glass powder plated with any of the above metals, ceramic powder plated with any of the above metals, resin powder plated with any of the above metals, graphite and mixtures thereof.

4. The electrically conductive adhesive according to claim 1, wherein the electrically conductive powder is selected from the group consisting of spherical silver powder, flaked silver powder, colloidal metal powder or precious metal resinate powder.

5. The electrically conductive adhesive according to claim 1, further comprising an inorganic substance having a thermal conductivity of 20 W/km or more.

6. The electrically conductive adhesive according to claim 1, wherein an organic solvent having a boiling point of 100 degrees or higher is contained at 4% by weight to 30% by weight based on the total weight of the electrically conductive powder.

7. An electric circuit board comprising: a substrate; an electric circuit formed on the substrate; the electrically conductive adhesive according to claim 1 applied onto the electric circuit; and an adhered object adhered to the electrically conductive adhesive.

8. An electric circuit board comprising: a substrate; an electric circuit formed on the substrate; the electrically conductive adhesive according to claim 1 applied onto a portion where the electric circuit is not formed; an adhered object adhered to the electrically conductive adhesive; and an electrically conductive connecting material that connects the adhered object to the electric circuit.

9. An electric circuit board comprising: a substrate; the electrically conductive adhesive according to claim 1 applied onto an electric circuit pattern on the substrate; and, an adhered object adhered to the electrically conductive adhesive.

10. The electrically conductive adhesive according to claim 1, wherein the amount of the electrically conductive powder is 70% by weight to 90% by weight based on the total weight of the electrically conductive adhesive, wherein the amount of the heat-curable silicone resin is 5% by weight to 20% by weight based on the total weight of the electrically conductive powder, and wherein the amount of the solvent is 4% by weight to 30% by weight based on the total weight of the electrically conductive powder.

11. The electrically conductive adhesive according to claim 1, wherein the electrically conductive powder comprises a nano-sized metal powder having a mean particle size of 1 nm to 100 nm and a spherical silver powder having a mean particle size of 0.3 μm to 3.0 μm.

12. The electrically conductive adhesive according to claim 1, wherein the electrically conductive powder comprises a nano-sized metal powder having a mean particle size of 1 nm to 100 nm and a flaked silver powder having a mean particle size of 0.3 μm to 10 μm.

13. The electrically conductive adhesive according to claim 1, wherein the electrically conductive powder comprises 80% by weight to 99% by weight of a spherical silver powder and 1% by weight to 20% by weight of a colloidal silver powder based on the total weight of the electrically conductive powder.

14. The electrically conductive adhesive according to claim 1, wherein the electrically conductive powder comprises 90% by weight to 99% by weight of a flaked silver powder and 1% by weight to 10% by weight of a colloidal silver powder based on the total weight of the electrically conductive powder.

15. The electrically conductive adhesive according to claim 1, wherein the electrically conductive powder comprises 70% by weight to 90% by weight of a spherical silver powder and 10% by weight to 30% by weight of a flaked silver powder based on the total weight of the electrically conductive powder.

16. The electrically conductive adhesive according to claim 1, wherein the 70% or more of the heat-curable silicone resin changes to inorganic oxide at 300 degrees or lower.

17. An electric circuit board according to claim 7, wherein the adhered object is a LED devise or a LED package.

18. An electric circuit board according to claim 8, wherein the adhered object is a LED devise or a LED package.

* * * * *